United States Patent [19]
Park et al.

[11] Patent Number: 5,729,551
[45] Date of Patent: Mar. 17, 1998

[54] SPACE EFFICIENT COLUMN DECODER FOR FLASH MEMORY REDUNDANT COLUMNS

[75] Inventors: Eung Joon Park; Hsi-Hsien Hung, both of Fremont, Calif.

[73] Assignee: Integrated Silicon Solution, Inc., Santa Clara, Calif.

[21] Appl. No.: 768,914

[22] Filed: Dec. 17, 1996

[51] Int. Cl.$^6$ .................................................. G11C 29/00
[52] U.S. Cl. ........................ 371/10.3; 365/200; 365/201
[58] Field of Search .......................... 371/10.3, 10.2, 371/21.2; 365/189.07, 189.11, 190, 191, 200, 201, 230.06

[56] References Cited

U.S. PATENT DOCUMENTS

| | | | |
|---|---|---|---|
| 4,250,570 | 2/1981 | Tsang et al. | 365/200 |
| 5,297,085 | 3/1994 | Choi et al. | 365/200 |
| 5,327,380 | 7/1994 | Kersh, III et al. | 365/195 |
| 5,471,426 | 11/1995 | McClure | 365/200 |

*Primary Examiner*—Hoa T. Nguyen
*Attorney, Agent, or Firm*—Gary S. Williams; Flehr Hohbach Test Albritton & Herbert LLP

[57] ABSTRACT

The present invention is a space efficient redundant column decoder circuit for use in a non-volatile memory device. The redundant column decoder compares a n-bit stored defective address with a n-bit presented address. Based on this comparison, an output signal is generated. This output signal is used both to specify the redundant column (or set of columns) associated with the redundant column decoder circuit, and to de-activate all of the other column decoders in the device. The redundant column decoder has a pull-up path and a parallel combination of n pairs of complementary pull-down paths. The pull-up path is connected to the pull-down paths at an output node, and the output signal is taken at this output node. Each pair of complementary pull-down paths has a first pull-down path and a second pull-down path. The first pull down path has a first non-volatile memory cell in series with and connected to a first address transistor. The first address transistor is also connected to the output node. The second pull-down path has a second non-volatile memory cell in series with and connected to a second address transistor. The second address transistor is also connected to the output node. At least one of the pull-down paths is conductive when the stored defective address does not match the presented address. Conversely, all of the pull-down paths are non-conductive when the stored defective address matches the presented address.

5 Claims, 3 Drawing Sheets

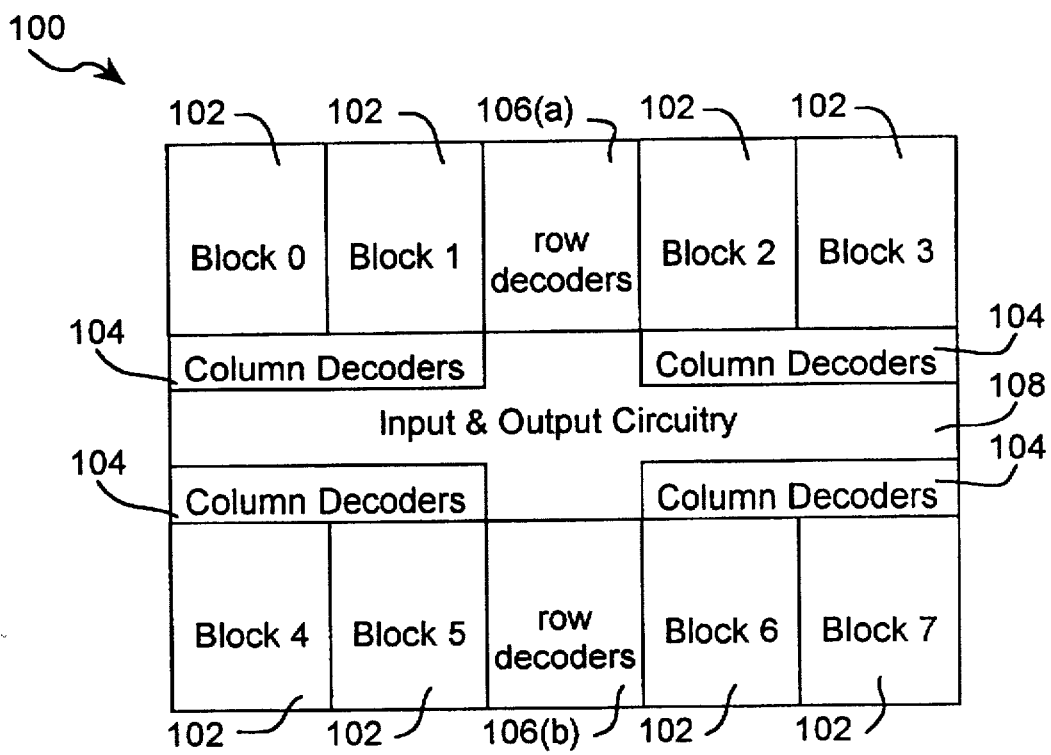
Prior Art   FIG. 1
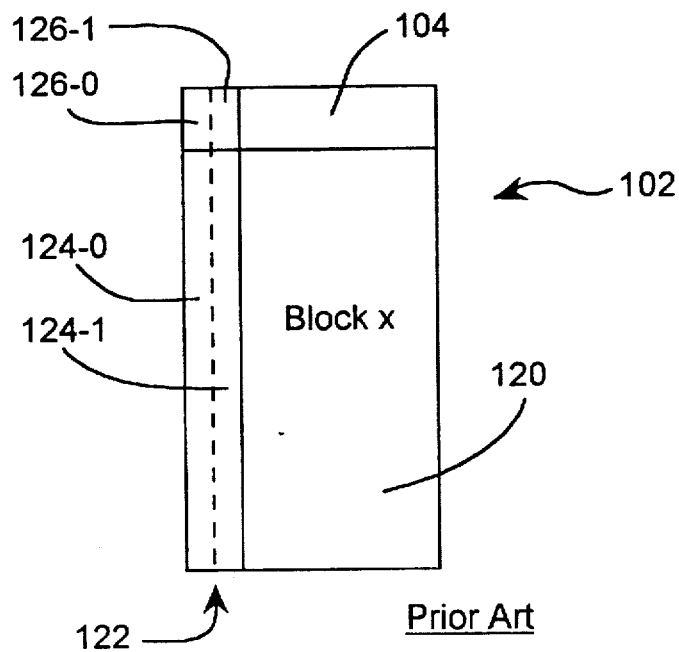
Prior Art
FIG. 2

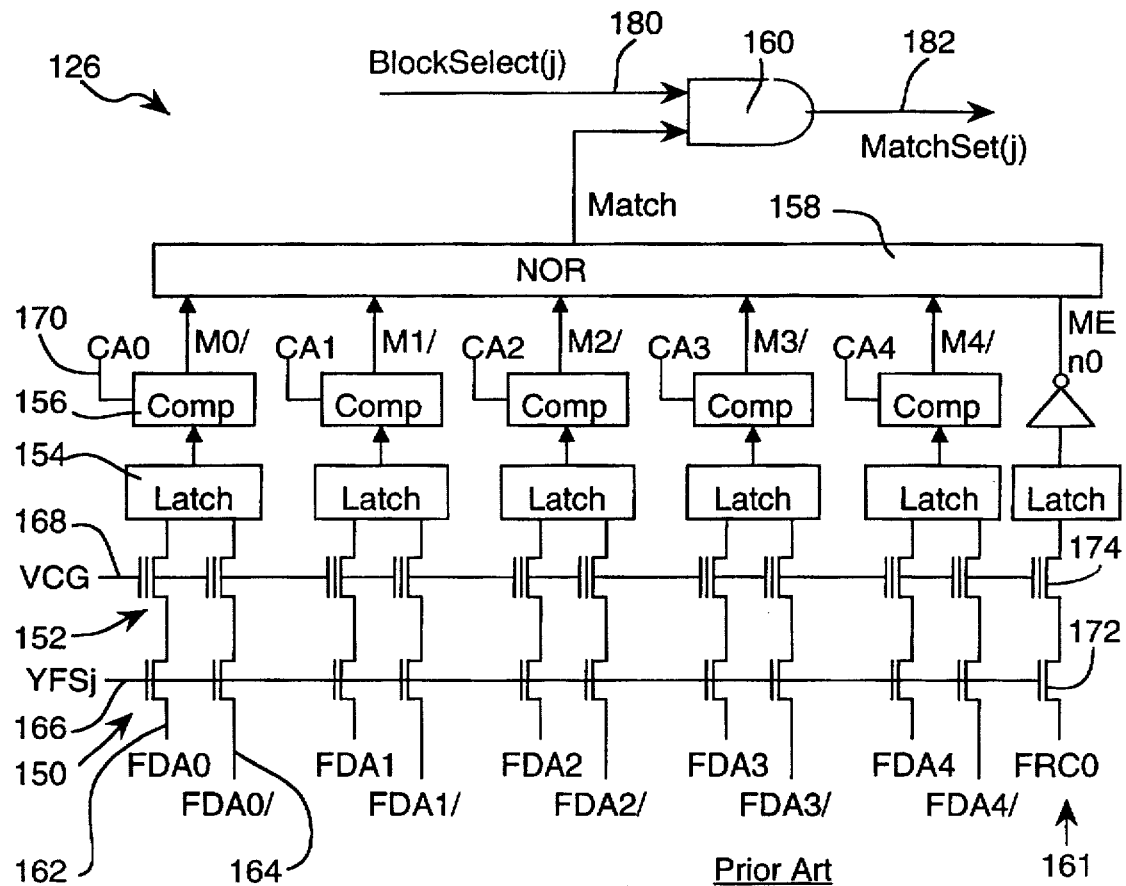
FIG. 3 *Prior Art*
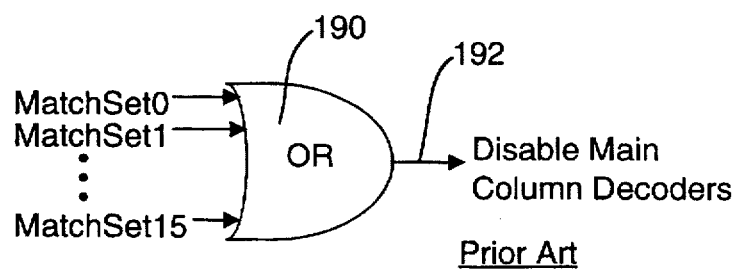
FIG. 4 *Prior Art*

5,729,551

SPACE EFFICIENT COLUMN DECODER FOR FLASH MEMORY REDUNDANT COLUMNS

The present invention relates generally to flash memory and other non-volatile random access memory products, and particularly to a space efficient, high speed column decoder circuit for selecting redundant columns in such memory circuits.

BACKGROUND OF THE INVENTION

The two primary concerns in the design of flash memory and other non-volatile random access memory products are speed and die size. The speed of the memory device must be constantly increased to keep pace with advances in microprocessor design. Die size must be constantly decreased in order to keep pace with increasing demands for storage capacity.

Die size can be reduced in two general ways. First, the size of the individual components on the die can be reduced. Second, the number of components on the die can be reduced. The present invention involves reducing the number of components on the die without experiencing a decrease in speed.

In a typical memory device individual memory cells are arranged in one or more arrays. Within these arrays, a cell is referenced by its corresponding row and column. Thus, when a cell's row and column are selected, the memory cell is activated, and the cell may be read from or written to. The row and column which activate a particular cell are referred to as the cell's row address and column address. Thus, the cell at the intersection of the fifth row and the tenth column has a row address of five and a column address of ten.

More than one cell may have the same "row and column address." For instance, one "column address" may actually select eight columns in the array. Thus, a single column address, along with a row address, may activate more than one (in this case eight) memory cells. In this case, the "column address" is really the address of a set of columns. Therefore, the term column address may refer to the address of a single column or to the address of a set of columns.

Occasionally, errors in the manufacturing process will cause groups of memory cells to be defective. Therefore, redundant memory cells are typically provided to store data which would have been stored in the defective cells. These extra, redundant cells are also organized into arrays, and referenced by rows and columns.

Prior art memory devices store the column addresses of the defective columns (or sets which contain defective columns) in non-volatile memory cells. A redundant column decoder then compares the column addresses as they are presented to the device with the column addresses which are stored. One redundant column decoder is provided for each redundant column (or set of redundant columns) so that all of the comparisons may be made simultaneously. When a match is made, the redundant column decoder which has the matching address selects the redundant column (or set of redundant columns) to which it is connected and de-activates all other column decoders on the device. Thus, column addresses which would have mapped to the defective columns are effectively re-mapped to the redundant columns.

The comparison circuitry in the redundant column decoders takes a large amount of space on the die. To reduce die size on some devices, only one comparator is provided for each redundant column decoder. The decoder sequentially compares each column address presented to the device with all of the stored column addresses of the defective columns (or sets containing defective columns). When a match is found, the redundant column (or set of columns) corresponding to the column address presented is selected and the main column decoders on the device are de-activated. While this method greatly reduces die size, it is also very slow.

It is an object of the present invention, therefore, to provide a redundant column decoder circuit which is both small and fast.

SUMMARY OF THE INVENTION

In summary, the present invention is a space efficient redundant column decoder circuit for use in a non-volatile memory device.

The redundant column decoder circuit of the present invention compares a n-bit stored defective address with a n-bit presented address. Based on this comparison, an output signal is generated. This output signal is used both to specify the redundant column (or set of columns) associated with the redundant column decoder circuit, and to de-activate all of the other column decoders in the device.

The redundant column decoder of the present invention comprises a pull-up path and a parallel combination of n pairs of complementary pull-down paths. The pull-up path is connected to the pull-down paths at an output node, and the output signal is taken at this output node.

Each pair of complementary pull-down paths comprises a first pull-down path and a second pull-down path. The first pull down path comprises a first non-volatile memory cell in series with and connected to a first address transistor. The first address transistor is also connected to the output node. The second pull-down path comprises a second non-volatile memory cell in series with and connected to a second address transistor. The second address transistor is also connected to the output node.

At least one of the pull-down paths is conductive when the stored defective address does not match the presented address. Conversely, all of the pull-down paths are non-conductive when the stored defective address matches the presented address.

BRIEF DESCRIPTION OF THE DRAWINGS

Additional objects and features of the invention will be more readily apparent from the following detailed description and appended claims when taken in conjunction with the drawings, in which:

FIG. 1 is a block diagram of a typical prior art non-volatile memory device.

FIG. 2 is a diagram of a single block of memory cells.

FIGS. 3–4 is a circuit diagram of a prior art redundant column decoder.

DESCRIPTION OF THE PREFERRED EMBODIMENTS

Figure 5:
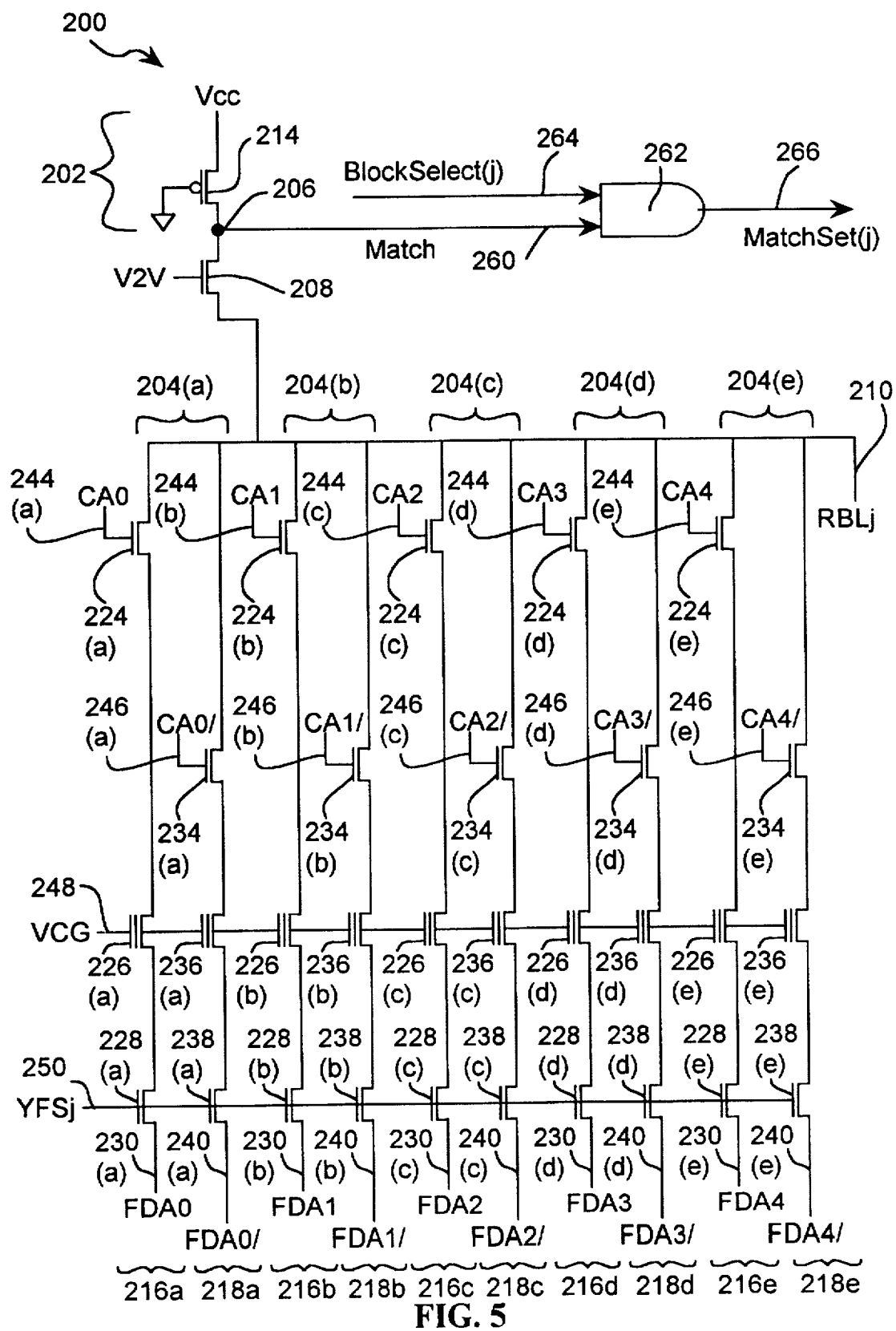
FIG. 5 is a circuit diagram of the redundant column decoder of the present invention.

Throughout the specification, the subscript "n" is used to refer to the number of bits in the column address, the subscript "m" is used to represent an individual bit in the column address, and the subscript "j" is used to refer to one of the redundant columns, or sets of redundant columns, on the memory device.

FIG. 1 shows a typical one-megabit (128k×8 bit) flash memory device 100, wherein individual memory cells are arranged into eight arrays 102, called blocks or sectors. Each array 102 is associated with column decoders 104 and row decoders 106 which select individual cells within the arrays 102 by specifying their rows and columns. As shown, blocks 0–3 share a first row decoder 106-a, and blocks 4–7 share a second row decoder 106-b.

Individual memory cells are selected in the following way. First, a 17-bit logical address is presented to the device 100. Using this logical address, the column decoders 104 select one group of eight columns within each block 102. The row decoders 106 use the logical address to select one row within each block 102. Thus, eight memory cells are selected in each block 102 by the column decoders 104 and row decoders 106. Out of these sixty-four cells, eight cells from one block are connected to the input and output circuitry 108 by a block selector circuit (not shown).

FIG. 2 shows one of the eight blocks 102. Each block 102 has a main memory area 120 of 128k memory cells arranged in 256 columns and 512 rows. As discussed above, the column decoder 104 specifies eight columns for each logical address. There are therefore thirty-two (256 / 8) sets of columns in the main memory area 120 of each block which may be independently specified. Each of these thirty-two sets is designated with a unique five bit identifier, or column address, corresponding to the five low order bits of the logical address.

Each block 102 also has a redundant memory area 122 containing two sets of eight redundant columns 124-0 and 124-1. Therefore, up to two sets of columns from the main memory area 120 can be re-mapped into the redundant memory area 122. If there are less than two defective sets in the main memory area 120, the remaining redundant sets are unused.

A redundant column decoder 126 is associated with each redundant set 124. Each redundant column decoder 126 is assigned a column address which corresponds to a defective set of columns in the main memory area 120. When the column address presented to the decoder 126 matches the one to which it was assigned, the redundant column decoder 126 specifies its set of redundant columns 124 and de-activates the main column decoder 104.

FIG. 3 shows a redundant column decoder 126. As discussed above, the redundant column decoder 126 looks at the presented column address to determine if it specifies a defective set of columns. When it does, the redundant column decoder 126 specifies the eight redundant columns in its set and sends a signal to de-activate the main column decoder.

The redundant column decoder 126 has six main groups of components. These groups are access transistors 150, EEPROM cells 152, latches 154, comparators 156, a "NOR" gate 158 (which performs a standard boolean NOR function), and an "AND" gate 160 (which performs a standard boolean AND function). In addition to these groups, there is a group of components which act as a redundant column enable mechanism 161.

There are ten access transistors 150; two for each bit in the column address. These ten transistors 150 are connected to "fuse data" lines 162 (FDA0–FDA4) and 164 (FDA0/ –FDA4/). The gate of each of the access transistors 150 is connected to the YFS line 166.

Each access transistor is connected to an EEPROM cell 152. The gate of each EEPROM cell 152 is connected to the VCG line 168. The ten EEPROM cells 152 are also grouped into five groups of two.

Each group of two EEPROM cells 152 is connected to a latch 154. Each of the five latches 154 is connected to one of the two inputs of a comparator 156. The five comparators 156 are also connected to the column address lines 170 (CA0–CA4). The low asserted outputs (M0/–M4/) of the five comparators 156 are connected to five of the six inputs of the NOR gate 158.

The enable mechanism 161 is comprised of an access transistor 172 and a EEPROM cell 174. The access transistor 172 is connected to the EEPROM cell 174 and the FRC line 176. The gate of the access transistor 172 is connected to the YFS line 166. The gate of the EEPROM cell 174 is connected to the VCG line 168. The other terminal of the EEPROM cell 174 is labeled Match Enable (ME) and is connected to the sixth input of the NOR gate 158.

The output of the NOR gate 158 is connected to one input of the AND gate 160. The other input to the AND gate 160 is connected to the BlockSelect(j) signal 180. The BlockSelect(j) signal 180 is generated from three of the seventeen address signals by the block select circuitry (not shown) so as to select and enable operation of just one of the eight memory array blocks 102. Finally, the output of the AND gate 160 is connected to the MatchSet(j) signal 182.

The circuit operates as follows. Shortly after manufacture, the device is tested and columns containing defective cells in the main memory area and the redundant memory area are identified. Each set of eight columns having a shared column address is identified as a "defective set of columns" if it contains at least one defective cell. If any block 102 contains more than two defective sets of columns, the memory device 100 is rejected as a defective part. Otherwise, the redundant column decoders are programmed so as to replace the defective sets of columns in the main memory area with non-defective redundant sets of columns. In particular, the five-bit address of each defective set is then assigned to a non-defective redundant set. For example, if set nineteen (binary 10011) in the main memory area of a particular block contained a defective column, address nineteen would be assigned to one of that block's non-defective redundant sets.

This assignment is done by programming the EEPROM cells 152 in the redundant column decoder with the address of the defective set. During this programming phase, the access transistors 166 are used to access the EEPROM cells 152, and the programming data is presented on the fuse data lines 162 and 164 (FDA0–FDA4 and FDA0/–FDA4/). For example, to program the EEPROM cells 152 for address 19, FDA0–FDA4 would contain the bit pattern 10011, and FDA0/–FDA4/would contain the bit pattern 01100. After programming, the EEPROM cells 152 retain the data which was presented on the corresponding FDAm lines 162 and 164 during programming.

When a "0" or "low" value is stored in an EEPROM cell 152, the EEPROM cell 152 is programmed to have a "high" threshold voltage, such as 6 volts (and more generally, the threshold voltage is set to a voltage that is equal to or higher than the maximum operating voltage of the memory device). When a "1" or "high" value is stored in an EEPROM cell 152, the EEPROM cell 152 is programmed to have a "low" threshold voltage, typically between 0 and 1.5 volts. Thus an EEPROM cell 152 programmed with a "0" or "low" value will provide a high impedance source to drain current path when its gate voltage VCG is high; whereas an EEPROM cell 152 programmed with a "1" or "high" value will provide a low impedance source to drain current path at all times.

Thereafter, at power-up or at reset, data from the ten EEPROM cells 152 is latched into the five latches 154. After the redundant column address data has been latched into the latches 154, the VCG and YFSj signals are deactivated because the access transistors 150 and EEPROM cells 152 are not used during memory access operations. Then, each time a column address is presented to the redundant column decoder 126 on the column address lines 170 (CA0–CA4), the comparators 156 compare the address in the latches 154 to the address presented on the column address lines 170. Where the two addresses match, the outputs from the comparators 156 (M0/–M4/) will all be low. If any bit in the column address does not match, however, the output of the corresponding comparator 156 will be high. Only when all of the outputs (M0/–M4/) are low will the output of the NOR gate 158 be high. Then, if the block is selected, the output of the AND gate 160, which is MatchSet(j) 182, will be high, indicating that the block and column address of a defective set has been presented. This signal is then used to select the eight redundant columns and to deactivate the main column decoders.

It is noted that the current paths for asserting high or low voltages on M0/–M4/are provided by the comparators 156. No currents associated with the address comparison process flows through the latches 154, EEPROM cells 152 or access transistors 150.

Where the redundant set is being used, as in the previous example, the circuit must be enabled. This is done at the same time as the initial EEPROM programming by programming a high value in the enable EEPROM cell 174. Thus, the ME input to the NOR gate 161 will always be low and the circuit will operate as described above.

If there are fewer than two defective sets in the main memory area, one or more of the redundant sets will not be used. The unprogrammed redundant column decoder 126 is automatically disabled because EEPROM cells 174 have a low threshold after a flash electrical erase or a UV erase.

There are eight blocks of memory cells in the typical device as described. Each block has two redundant sets. Thus, there are sixteen redundant sets, and sixteen redundant decoders on the device. For every logical address presented, therefore, there are sixteen possible matches. The main column decoders should only be disabled, and the redundant set selected, if the five-bit address match occurs in the current addressed block, i.e., the block which is connected to the input/output circuitry. This is assured by the final "and" gate 160, which blocks the output of the NOR gate 158 (by holding the MatchSet(j) 182 signal low) when the block is not selected (BlockSelect(j) 180 is low).

FIG. 4 shows the generation of the signal to disable the main column decoders. The sixteen outputs from the redundant decoders, MatchSet0–MatchSet15, are fed into an OR gate 190. The output of the OR gate 190 is the Disable Main Column Decoders signal 192.

The extra decoder circuitry necessary to specify the redundant cells increases the die size significantly. In total, the redundant decoders comprise 176 access transistors, 176 EEPROM cells, 80 latches, 80 comparators, and 16 six-input NOR gates. One method of reducing this circuitry uses only one comparator for each redundant decoder (instead of five for every redundant decoder) which serially compares the presented address to each of the stored defective addresses. Thus, this method reduces the number of comparators and latches to sixteen. Unfortunately, this gain is offset by an increase in control circuitry. Further, the serial comparison is much too slow for high speed memory devices.

FIG. 5 shows the redundant column decoder of the present invention. As described above, the typical memory device uses a five-bit column address. Therefore, the redundant column decoder will be shown for use with a five-bit column address (n=5). Of course, the circuit shown may be readily adapted for use with other bit-width comparisons without departing from the scope of the present invention.

As shown in FIG. 5, the redundant column decoder 200 comprises a pull-up path 202 and five pairs of complementary pull-down paths 204(a)–204(e). One pair of complementary pull-down paths is provided for each bit of the column address. The pull up path 202 is connected to the pull down paths 204(a)–204(e) at an output node 206.

In the circuit of FIG. 5, the connection of the pull-down paths 204(a)–204(e) to the output node 206 is made through a NMOS transistor 208. The resistance of transistor 208 in conjunction with the capacitance of node 210 helps to filter out high frequency noise from the pull-down paths 204(a)–204(e), thereby reducing noise on output node 206. The node where the pull-down paths 204 connect to the transistor 208 is connected to the RBLj signal 210.

The pull-up path 202 is comprised of a PMOS transistor 214. The gate of the pull-up transistor 214 is connected to ground, its source node is connected to the power supply node, Vcc, and its drain is connected to the output node 206.

Each pair of complementary pull-down paths 204(a)–204(e) has a first pull-down path 216(a)–216(e) and a second pull-down path 218(a)–218(e). Each pair of complementary pull down paths 204(a)–204(e) has identical components. The pair of complementary pull-down paths associated with bit zero of the column address 204(a) will be described.

The first pull-down path 216(a) has a first NMOS address transistor 224(a) connected to the output node 206 (via NMOS transistor 208). Connected in series with the first address transistor 224(a) is a first non-volatile memory cell 226(a). In the preferred embodiment, the non-volatile memory cells are EEPROM cells, but other types of non-volatile memory cells could be used in alternate embodiments. In series with and connected to the first non-volatile memory cell 226(a) is a first NMOS access transistor 228(a). The first access transistor 228(a) connects signal FDA0 230(a) to the non-volatile memory cell 226(a).

The second pull-down path 218(a) has a second (NMOS) address transistor 234(a) connected to the output node 206 (via NMOS transistor 208). Connected in series with the second address transistor 234(a) is a second non-volatile memory cell 236(a). In series with and connected to the second non-volatile memory cell 236(a) is a second (NMOS) access transistor 238(a). The second access transistor is also connected to the signal FDA0/240(a).

The gate of the first address transistor 224(a) is connected to the column address signal CA0 244(a). The gate of the second access transistor 234(a) is connected to the complementary column address signal CA0/246(a). The gates of both the first and second non-volatile memory cells 226(a) and 236(a) are connected to the signal VCG 248. The gates of the first and second access transistors 228(a) and 238(a) are connected to the signal YFSj 250.

As described above, each of the other pairs of complementary pull-down paths 204(b)–204(e) has components identical to the first pair of complementary pull-down paths just described 204(a). The connection of the other pairs is also identical to the connection described above except as follows.

Each pair of complementary pull-down paths 204(a)–204(e) is associated with one bit of the column address. Thus, the gates of the first and second address transistors 244(a) and 234(a) in the complementary pair of pull-down paths associated with bit zero of the column address 204(a) are connected to the column address signals CA0 and CA0/244 (a) and 246(a) respectively as described above. In general, the gates of the first and second address transistors 224(a) –224(e) and 234(a)–234(e) of the pair of complementary pull-down paths associated with bit m of the column address are connected to the CAm and CAm/signals 244(a)–244(e) and 246(a)–246(e) respectively. Likewise, in general, the first and second access transistors 228(a)–228(e) and 238 (a)–238(e) of the pair of complementary pull-down paths associated with bit m of the column address are connected to the FDAm and FDAm/signals 230(a)–230(e) and 240(a) –240(e) respectively.

As in the prior art circuit shown in FIGS. 3, the output signal 260 (labeled MATCH) is connected to one input of an AND gate 262. The other input to the AND gate is connected to the BlockSelect(j) signal 264. The output of the AND gate is labeled MatchSet(j) 266.

The circuit of FIG. 5 operates in three modes: erase, program, and compare. (In the description which follows, voltage levels are given for a typical five-volt sector erasable flash memory device. Of course these voltages could easily be adjusted to adapt the present circuit for use with other memory devices without departing from the scope of the present invention.) As in the prior art circuit, shortly after manufacture, defective columns in the main and redundant memory areas are identified. If there are less than two defective sets of columns in the main memory area, one or more of the redundant columns will not be used. To disable the redundant column decoder for the unused columns, all the decoder "fuses" (i.e., EEPROM cells 226, 236) in the redundant column decoder are erased.

During erase mode, VCG 248 is held at about –10 V; YFSj 250 is held at ground; FDA0–FDA4 and FDA0/ –FDA4/230 and 240 are held at ground; CA0–CA4 and CA0/–CA4/244 and 246 are held at VCC, and RBLj 210 is held at about 4 V. Erasing the non-volatile memory cells 226 and 236 in this way gives all of the non-volatile memory cells 226 and 236 a low threshold voltage Vth (about 1.5 V). All of the non-volatile memory cells 226 and 236 are therefore conductive.

After the device has been erased, all of the redundant column decoders 200 are disabled. If a redundant column decoder 200 is to be enabled to replace a defective set of columns in the main memory area, the non-volatile memory cells 226 and 236 in that redundant set are programmed with the column address of the defective set. During program mode, VCG 248 is held at about 10 v; RBLj 210 is held at ground; and CA0–CA4 and CA0/–CA4 244 and 246 are held at VCC. When block j is being programmed, YFSj 250 is held at 10 v. When block j is not being programmed, and another one of the blocks is being programmed, YFSj 250 is held at ground. FDA0–FDA4 230 contain bits zero through n–1 of the column address; and FDA0/–FDA4/240 contain the boolean negations of bits 0 through n–1 of the column address.

The result of the programming is that for each pair of complementary pull-down paths 204, one non-volatile memory cell 226 or 236 has a low threshold voltage (about 1.5 V) (is conducting) and the other non-volatile memory cell 226 or 236 has a high threshold voltage (>6 V) (is non-conducting). Thus, when the redundant column decoder 200 is enabled, the non-volatile memory cells 226 and 236 in each pair of pull-down paths 204 are in complementary states (i.e., one is in a conducting state and the other is not).

For example, if bit zero (0) of the column address to program was one (1), FDA0 230(a) would be high and FDA0/240(a) would be low. Thus, the first non-volatile memory cell 226(a) would have a high Vth and the second non-volatile memory cell 236(a) would have a low Vth.

Following erase mode and program mode, the device is ready for normal operation, or compare mode. During compare mode, VCG 248 is held at VCC, YFSj 250 is held at VCC, FDA0–FDA4 and FDA0/–FDA4/230 and 240 are held at ground, and RBLj 210 is left to float. CA0–CA4 244 are connected to bits zero through n–1 of the presented column address, and CA0/–CA4/246 are connected to the negation of bits zero through n–1 of the presented column address.

The values of the various signals is summarized in the following table:

|          | Erase | Program            | Compare          |
|----------|-------|--------------------|------------------|
| VCG      | –10 V | –10 V              | VCC              |
| YFSj     | GND   | –10 V,GND          | VCC              |
| FDAm,FDAm/ | GND | FuseData,FuseData/ | GND              |
| CAm,CAm/ | VCC   | VCC                | ColAddr,ColAddr/ |
| RBLj     | –4 V  | GND                | Floating         |

During normal operation, the redundant column decoder 200 compares the presented column address (presented on signals CAm 244 and CAm/246) with the stored column address as follows. If the first bit of the stored column address was a one (1), then the first non-volatile memory cell 226(a) will have a high Vth (non-conducting) and the second non-volatile memory cell 236(a) will have a low Vth (conducting). Therefore, the first pull-down path 216(a) is never conducting. The second pull-down path 218(a) will be conducting when the second address transistor 234(a) is conducting because both the first and second access transistors 228(a) and 238(a) are always in a conducting state during normal operation of the memory device.

If the first bit of the presented column address is also a one (1), a zero (0, the negation of 1) will be presented to the gate of the second address transistor 234(a) via signal CA0/246 (a). Thus, the second address transistor 234(a), and therefore the second pull-down path 218(a), will be non-conducting. If all of the bits of the presented column address match the stored column address, none of the pull-down paths 216 and 218 will be conducting. As a result, the pull-up path 202 will pull the output 260 at the output node 206 high, indicating that a match has been found.

On the other hand, if the first bit of the presented column address is not a one (1) (i.e., the first bit is a 0), a one (1, the negation of 0) will be presented to the gate of the second address transistor 234(a). Thus, the second address transistor 234(a), and therefore the second pull-down path 218(a), will be conducting. As a result, if any bit in the presented column address does not match its stored counterpart, the corresponding pair of pull-down paths 204 will pull the output node 206 low, indicating that all of the bits did not match.

Where the non-volatile memory cells 226 and 236 were erased, so as to disable the redundant column decoder 200, all of the non-volatile memory cells 226 and 236 will be conducting. Therefore, no matter what address is presented, at least one of the address transistors 244 or 246 will be turned on in each pair of pull- down paths. Therefore, for every column address presented, one half of the pull-down paths 216 and 218 will be conducting, and the output 260 will always be pulled low.

The match signal 260 at the output 206 is treated identically as in the prior art circuit described above. The output signal 206 is first masked by the EnableSet(j) signal 264, resulting in the MatchSet(j) signal 266. The MatchSet(j) signal 266 from each of the sixteen redundant column decoders 200 is presented to an OR gate (as shown in FIG. 4) resulting in the disable main column decoders signal.

The present invention, as shown in FIG. 5, reduces the die area necessary for the redundant column decoders by reducing the number of components necessary to compare the presented address with the stored address. For the five-bit column address shown, the present invention eliminates the need for 80 latches, sixteen non-volatile memory cells (for enabling the sixteen redundant column decoders) and sixteen access transistors. The present invention also eliminates the need for 80 comparators, substituting the area of 80 much smaller NMOS transistors in their place. As a result of these savings, the size of the redundant decoder circuitry for the device is reduced by about 50% without significantly impacting the speed of the device.

While the present invention has been described with reference to a specific embodiment, the description is illustrative of the invention and is not to be construed as limiting the invention. Various modifications may occur to those skilled in the art without departing from the true spirit and scope of the invention as defined by the appended claims.

What is claimed is:

1. A redundant column decoder circuit for comparing a n-bit stored defective address with a n-bit presented address and generating an output signal, said circuit comprising:

a pull-up path, and a parallel combination of n pairs of complementary pull-down paths, connected to said pull-up path at an output node, said output signal being taken at said output node, wherein each of said pair of pull-down paths comprises,
      a first pull-down path comprising a first non-volatile memory cell in series with and connected to a first address transistor, said first address transistor further connected to said output node, and
      a second pull-down path comprising a second non-volatile memory cell in series with and connected to a second address transistor, said second address transistor further connected with said output node, wherein at least one of said pull-down paths is conductive when said stored defective address does not match said presented address, and all of said pull-down paths are non-conductive when said stored defective address matches said presented address.

2. A circuit according to claim 1 wherein
   the gate of said first address transistor is connected to an address signal representing one bit of said presented column address,
   the gate of said second address transistor is connected to a signal which represents the logical negation of said address signal, and
   said first non-volatile memory cell is in a complementary state to said second non-volatile memory cell when said redundant column decoder circuit is comparing said stored defective column address and said presented column address.

3. A circuit according to claim 2 wherein said first pull down-path further comprises a first access transistor in series with and connected to said non-volatile memory cell, and said second pull-down path further comprises a second access transistor in series with and connected to said second non volatile memory cell.

4. A redundant column decoder circuit for comparing a n-bit column address with a n-bit presented address and generating an output signal, said circuit comprising:

n parallel address bit comparison circuits, each address bit comparison circuit including:
      a pair of non-volatile memory cells, including a first non-volatile memory cell for storing one respective bit of said n-bit column address and a second non-volatile memory cell for storing said one bit's boolean negation; and
      a pair of transistors, wherein each transistor in said pair of transistors is connected in series with a respective non-volatile memory cell in said pair of non-volatile memory cells, said pair of transistors having a first transistor whose gate is coupled to a respective presented address bit signal representing a respective bit of said n-bit presented address and a second transistor whose gate is coupled to a signal comprising the boolean negation of said signal coupled to the gate of said one first transistor;

each address bit comparison circuit forming two parallel current paths; and a summing circuit node coupled to the parallel current paths in all of said n parallel address bit comparison circuits, such that when said n-bit address does not match said presented address said summing circuit node is driven to a first signal state and when said n-bit address does match said presented address said summing circuit node is driven to a second signal state that is the boolean negation of said first signal state.

5. A circuit according to claim 4 wherein each address bit comparison circuit further includes two access transistors, each connected in series with a respective one of said non-volatile memory cells, said access transistors providing access to said non-volatile memory cells for programming thereof and providing a current path during address decoding.

* * * * *